(12) United States Patent
Leussler et al.

(10) Patent No.: US 10,073,154 B2
(45) Date of Patent: Sep. 11, 2018

(54) MULTI-ELEMENT RF TRANSMIT COIL FOR MAGNETIC RESONANCE IMAGING

(71) Applicant: KONINKLIJKE PHILIPS N.V., Eindhoven (NL)

(72) Inventors: Christoph Leussler, Eindhoven (NL); Daniel Wirtz, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 379 days.

(21) Appl. No.: 14/774,175

(22) PCT Filed: Mar. 13, 2014

(86) PCT No.: PCT/IB2014/059703
§ 371 (c)(1),
(2) Date: Sep. 10, 2015

(87) PCT Pub. No.: WO2014/141109
PCT Pub. Date: Sep. 18, 2014

(65) Prior Publication Data
US 2016/0033591 A1 Feb. 4, 2016

Related U.S. Application Data

(60) Provisional application No. 61/778,770, filed on Mar. 13, 2013.

(51) Int. Cl.
*G01R 33/34* (2006.01)
*G01R 33/28* (2006.01)
(Continued)

(52) U.S. Cl.
CPC ........ *G01R 33/3415* (2013.01); *G01R 33/288* (2013.01); *G01R 33/34053* (2013.01);
(Continued)

(58) Field of Classification Search
CPC .......... G01R 33/3415; G01R 33/34084; G01R 33/34053; G01R 33/288; G01R 33/36; G01R 33/3692; G01R 33/5612
See application file for complete search history.

(56) References Cited

U.S. PATENT DOCUMENTS

| 9,229,074 B2 | 1/2016 | Voigt et al. | |
| 2005/0110487 A1* | 5/2005 | Zhu | G01R 33/3415 324/309 |

(Continued)

FOREIGN PATENT DOCUMENTS

| JP | 05237078 A1 | 9/1993 |
| WO | 2004089211 A2 | 10/2004 |

(Continued)

OTHER PUBLICATIONS

Graesslin et al "Safety Considerations Concerning SAR During RF Amplifier Malfunctions.." Proc. Intl. Soc. Mag. Reson. Med 14, (2006) p. 2041.

(Continued)

*Primary Examiner* — G. M. Hyder (57) ABSTRACT

The invention provides for a multi-element transmit coil (100) for a magnetic resonance imaging system (300). The multi-element transmit coil comprises multiple surface coil elements (102) with a coil circuit (104) that has an integrated a radio-frequency sensor (106, 604, 704, 804). The multi-element transmit coil further comprises a power monitoring unit (108) with an analog-to-digital converter (808). The power monitoring unit comprises a processor connected to each analog to digital converter that is operable for receiving a radio-frequency measurement for generating specific absorption rate data (348) for each of the multiple surface coil elements. The multi-element transmit coil further comprises an optical data transmission system (110) connected to the processor. The optical data transmission system is (Continued)

operable for connecting to a magnetic resonance imaging system controller (312, 330). The optical data transmission system is operable for transferring the specific absorption rate data to the magnetic resonance imaging system controller.

29 Claims, 7 Drawing Sheets

(51) Int. Cl.
*G01R 33/3415* (2006.01)
*G01R 33/36* (2006.01)
*G01R 33/561* (2006.01)

(52) U.S. Cl.
CPC ....... *G01R 33/34084* (2013.01); *G01R 33/36* (2013.01); *G01R 33/3692* (2013.01); *G01R 33/5612* (2013.01)

(56) References Cited

U.S. PATENT DOCUMENTS

| | | | | |
|---|---|---|---|---|
| 2007/0096735 | A1* | 5/2007 | Morich | G01R 33/28 324/318 |
| 2007/0241753 | A1* | 10/2007 | Sodickson | A61B 5/0536 324/307 |
| 2008/0182524 | A1* | 7/2008 | Graesslin | G01R 33/3415 455/73 |
| 2009/0128153 | A1* | 5/2009 | Graesslin | G01R 33/3607 324/322 |
| 2009/0267601 | A1* | 10/2009 | Van Helvoort | G01R 33/3415 324/309 |
| 2011/0043205 | A1 | 2/2011 | Graesslin | |
| 2011/0109312 | A1* | 5/2011 | Yamanaka | G01R 33/288 324/309 |
| 2011/0133729 | A1 | 6/2011 | Vernickel et al. | |
| 2011/0241681 | A1 | 10/2011 | Gudino | |
| 2013/0187651 | A1* | 7/2013 | Konta | G01R 33/5611 324/309 |
| 2014/0139218 | A1* | 5/2014 | Findeklee | G01R 33/3628 324/318 |
| 2014/0292332 | A1* | 10/2014 | Adolf | G01R 33/288 324/309 |

FOREIGN PATENT DOCUMENTS

| | | |
|---|---|---|
| WO | 2006117714 A2 | 11/2006 |
| WO | 2011061486 A1 | 5/2011 |
| WO | 2012129430 A2 | 9/2012 |

OTHER PUBLICATIONS

Graesslin et al, "A Specific Absorption Rate Prediction Concept for Paralel Transmission MR" Magnetic Resonance in Medicine 68: (2012) p. 1664-1674.

* cited by examiner

FIG. 11 ered to as a tangible computer readable medium. In some embodiments, a computer-readable storage medium may also be able to store data, which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor.

MULTI-ELEMENT RF TRANSMIT COIL FOR MAGNETIC RESONANCE IMAGING

CROSS-REFERENCE TO PRIOR APPLICATIONS

This application is the U.S. National Phase application under 35 U.S.C. § 371 of International Application No. PCT/IB2014/059703, filed on Mar. 13, 2014, which claims the benefit of U.S. Patent Application No. 61/778,770, filed on Mar. 13, 2013. These applications are hereby incorporated by reference herein.

TECHNICAL FIELD

The invention relates to multi-element transmit coils for magnetic resonance imaging, in particular to the generation of specific absorption ratio data for each element of the multi-element coil.

BACKGROUND OF THE INVENTION

In Magnetic Resonance Imaging (MRI), Radio-Frequency (RF) coils are used as antennas for exciting the nuclear spins and detecting signals from them. With the availability of low cost multi channel RF amplifiers, the total number of transmit channels is not anymore limited by costs. High count distributed RF amplifiers can supply multi element transmit arrays with a large number of coil elements to satisfy the increasing requirements of high field clinical applications.

A difficulty is that each individual coil of a multi channel RF system produces its own RF field, which may induce dangerous levels of heating within a subject when a magnetic resonance image is acquired.

In international patent application WO 2006/117714 A2, a multi-channel transmit/receive antenna for use in magnetic resonance imaging is disclosed. RF amplifiers can be used to their full peak power capability without running the risk that the RF amplifier is damaged due to excessive reflected power at its output. The specific absorption rate is monitored by evaluating certain forward and reflected power signals. In WO 2006/117714 A2 the use of circulators for performing the measurement is disclosed. The circulators are however not able to be used under high magnetic field conditions, such as exist within the bore of a magnet used for magnetic resonance imaging.

SUMMARY OF THE INVENTION

The invention provides for a multi-element transmit coil, a magnetic resonance imaging system and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium, which may store instructions that are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data, which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor.

Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory, which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component, which is able to execute a program or machine executable instruction or computer executable code. References to the computing device comprising "a processor" should be interpreted as possibly containing more than one processor or processing core.

Computer executable code may comprise machine executable instructions or a program, which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter, which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions, which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions, which execute on the computer or other programmable apparatus provide processes for implementing the functions/acts specified in the flowchart and/or block diagram block or blocks.

A 'user interface' as used herein is an interface, which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator.

A 'hardware interface' as used herein encompasses an interface, which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

The Specific Absorption Rate (SAR) is defined herein as the RF power absorbed per unit of mass. The local SAR is defined herein as the value of the SAR of the voxel with the largest SAR. The global SAR is defined herein as the SAR integrated over the whole object being imaged.

In one aspect the invention provides for a multi-element transmit coil for a magnetic resonance imaging system. The multi-element transmit coil comprises multiple surface coil elements. A surface coil as used herein encompasses a coil operable placed in close proximity with a subject. The surface coil may be placed on or near a surface of a subject. Each surface coil element comprises a coil circuit and each coil circuit comprises a radio-frequency sensor. The radio-frequency sensor could be a current sensor and/or a voltage sensor, which is incorporated into the coil circuit. The current measurement or the voltage measurement may be used in conjunction with a model of the circuit or empirical data to infer what the specific absorption ratio may be.

The multi-element transmit coil further comprises a power monitoring unit with an analogue-to-digital converter for each radio-frequency sensor connected directly to each radio-frequency sensor. That is to say there is an analogue-to-digital converter for each radio-frequency sensor. There may be a power monitoring unit, which connects to each of the digital-to-analog converters or there may be a power monitoring unit for each individual analogue-to-digital converter. The power monitoring unit comprises a processor connected to each analogue-to-digital converter. The processor is operable for receiving a radio-frequency measurement for each coil circuit using the analogue-to-digital converter connected to each current sensor. A radio-frequency measurement as used herein encompasses a measurement of a physical parameter or state of a radio-frequency circuit, which enables the determination of the radio-frequency properties of the circuit. For example the measurement of the radio-frequency voltage or current may enable the determination of radio-frequency fields or the SAR to be determined using modeling or experimental results.

The power monitoring unit is operable for generating specific absorption rate data from the radio-frequency measurement for each of the multiple surface coil elements. The multi-element transmit coil further comprises an optical data transmission system connected to the processor. The optical data transmission system is operable for connecting to a magnetic resonance imaging system controller. The optical data transmission system is operable for transmitting the specific absorption rate data from the processor to the magnetic resonance imaging system controller.

This embodiment may be operable to be used within the high magnetic field of a magnetic resonance imaging system.

This embodiment may be beneficial because the power monitoring unit or units provide data, which may be descriptive of the specific absorption rate for a particular surface coil of the multi-element transmit coil. By using a radio-frequency sensor in each coil circuit the individual surface coils can be monitored independently. If a particular surface coil is producing too much radio-frequency energy that the specific absorption ratio goes too high the power to that individual surface coil element or group of surface coil elements can be reduced to avoid overheating the subject. The multi-element transmit coil may be detachable from a magnetic resonance imaging system. Since surface coil elements are used it may be envisaged that the multi-element transmit coil would either be placed on or in proximity to a subject or may incorporate a structure for mounting the multi-element transmit coils in close proximity to a subject. The specific absorption rate data may take different forms in different embodiments. In some embodiments the specific absorption rate data may comprise an estimate of the specific absorption rate caused by a particular surface coil element. In other embodiments the raw data measured or simply an estimate of the radio-frequency current or voltage is incorporated or included in the specific absorption rate data.

The single power monitoring unit may in some embodiments be multiple power monitoring units. Likewise the processor could also be multiple processors. The optical data transmission system could include one or more optical fibers. In some embodiments the voltage or electrical power for powering the power monitoring unit may be supplied by a galvanic contact. This may enable the supplying of power even in a high magnetic field environment such as a magnetic resonance imaging system.

In another embodiment each of the multiple surface coil elements are flexible. In this embodiment the multi-element transmit coil may be placed on the surface of a subject. The flexible nature of the surface coil elements may enable the multi-element transmit coil to be placed on the subject in such a way that it conforms to the shape of the subject.

In another embodiment each of the multiple surface coil elements are fixed in a rigid support structure. The rigid support structure is operable for receiving a portion of the subject. In this embodiment the surface coils may be held in a particular position by a rigid support structure. This embodiment may be particularly useful for examining a particular portion of subject anatomy. For instance the rigid support structure may be operable for fitting around the head or other portion of the subject. This embodiment may have the benefit of putting the surface coil elements in a particular arrangement with respect to the anatomy of the subject.

In another embodiment at least a portion of the multiple surface coil elements overlap or the multiple surface coil elements do not overlap. In the case where the coil elements overlap the measurement of the radio-frequency current or voltage using the radio-frequency sensor is advantageous because it provides an estimate of the magnetic field or RF field produced solely by the particular coil circuit.

In another embodiment the power monitoring unit and each analogue-to-digital converter connected to each radio-frequency sensor is within a single housing.

In another embodiment the processor is operable to determine a specific absorption rate estimate for each of the multiple surface coil elements using the radio-frequency measurements and a lookup table. The specific absorption rate data comprises the specific absorption rate estimate for each of the multiple surface coil elements. The lookup table could be determined by making numerical models or it could be made using measurements on a phantom using the multiple surface coil elements. This embodiment may have the benefit of producing a very rapidly determined specific absorption rate estimate that may also be very accurate. This may enable real time control of a magnetic resonance imaging system to avoid overheating portions of the subject.

In another embodiment the specific absorption rate data comprises the radio-frequency measurements.

In another embodiment the radio-frequency sensor is a compensated butterfly coil. A compensated butterfly coil may also referred to as a compensated FIG. 8 coil, is a known type of coil used for making current or magnetic field measurements.

In another embodiment the radio-frequency sensor is a toroidal pickup coil. A toroidal pickup coil is a known type of magnetic field or current measurement coil and is also sometimes referred to as a B-dot probe.

In another embodiment the radio-frequency sensor is integrated into a capacitance in the coil circuit. The capacitance may for example be a lumped element component like a ceramic capacitor or a distributed capacitor, which consists of layeres of high Q PCB material. In some embodiments the voltage across the capacitance is measured over the capacitor via high impedance capacitive coupling or using small dipole antenna, which senses the local E-field. Such a E-field probe can be integrated in the PCB capacitor layout or directly glued on a lumped capacitor. This embodiment may have the benefit of incorporating a component of the coil circuit, which is already present into the radio-frequency sensor.

In another embodiment the processor is a field-programmable gate array. Field-programmable gate arrays may provide a cost effective and efficient means of providing for a power monitoring unit, which can be located on the multi-element transmit coil.

In another embodiment the multi-element transmit coil is further operable for receiving a magnetic resonance signal. For instance the multi-element transmit coil may also be a multi-element transmit and receive coil.

In another aspect the invention provides for a magnetic resonance imaging system comprising a magnetic resonance imaging system controller. The magnetic resonance imaging system controller is operable for receiving specific absorption ratio data from an optical data transmission system of a multi-element transmit coil according to an embodiment of the invention. The magnetic resonance imaging system comprises a multi-channel radio-frequency system. The multi-channel radio-frequency system is operable for supplying radio-frequency power to each of the multiple surface coil elements.

The magnetic resonance imaging system controller is operable for controlling the multi-channel radio-frequency system to reduce radio-frequency power supplied to a surface coil element selected from the multiple surface coil elements. If specific absorption ratie data indicates that the specific absorption rate is above a predetermined value for the surface coil element. This embodiment may have the benefit of automatically reducing or stopping a delivery of radio-frequency power to a surface coil element that is generating too much radio-frequency energy within a subject.

In another embodiment the magnetic resonance imaging system comprises the multi-element transmit coil.

In another embodiment the multi-element transmit coil is removable from the magnetic resonance imaging system.

In another aspect the invention provides for a computer program product comprising machine-executable instructions for execution by a magnetic resonance imaging system controller operable for receiving specific absorption rate data from an optical data transmission system of a multi-element transmit coil according to an embodiment of the invention. The magnetic resonance imaging system controller may for instance be a computer or have a processor, which may enable it for executing machine executable instructions. The magnetic resonance imaging system comprises a multi-channel radio-frequency system. The multi-channel radio-frequency system is operable for supplying radio-frequency power to each of the multiple surface coil elements.

Execution of the instructions causes the magnetic resonance imaging system controller to receive the specific absorption rate data from the optical data transmission system. Execution of the instructions further causes the magnetic resonance imaging system controller to control the multi-channel radio-frequency system to reduce the radio-frequency power supply to a surface coil element selected from the multiple surface coil elements if the specific absorption rate data indicates the specific absorption ratio is above a predetermined value for the surface coil element.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Monitoring of each individual transmit coil element may be beneficial for RF-safe operation. Examples may provide for an efficient way of providing RF safety concept by using local individual RF sensors within the coils.

Whole body multi-transmit body coils do have calibrated integrated pick-up coils (PUC) to locally monitor the B1 amplitude and phase of each individual transmit channel. For body coils, transmitter as well as PUC placement and geometry together with the necessary cabling is fixed in space and one initial calibration of the system is sufficient for proper operation. For coils placed on a subject or using flexible coils, such a solution is not an option.

For RF patient safety flexible transmit coil arrays may provide a RF safety concept, which guarantees full control of SAR and provide stable and reliable B1 monitoring and calibration, which does not depend on floating pick up coil cable and coupling issues due to flexibility.

In some examples each individual element of a local transmit (Tx) coil with a local digital Power Monitoring Unit (PMU) and RF sensor receiver, which monitors the B1 pulse status, and loading condition, allowing individual control and real time power monitoring ensuring RF safety.

The digital signals may be processed, e.g. using a FPGA. Using a Local PMU reduces the amount of connections and thus costs.

In a multi transmit array, each individual coil element may be monitored for safe operation of the array. Each coil element thus requires additional local sensors and corresponding cabling, which increases the complexity and cost of the overall coil design.

In some examples the RF signal from a sensor may be locally amplified and digitized. This may be done to calculate locally SAR and RF current or voltage of the coil. Such a system can provide independent safety for the patient even in case of severe failures like e.g. capacitor, PCB or feeding line breakdown, too much RF power (RF power amp, SW pulse calculation, . . . ).

Some examples may solve safety issues by monitoring individual B1 signal of each coil element using an RF current or voltage sensor and direct (on coil) sampling by an ADC as well as processing by an FPGA. Individual coil elements of a flexible transmit coil array have their unique individual SAR model stored in an FPGA processor for safety computation (local PMU).

For flexible multi-element transmit coil arrays monitoring of individual coil elements may be beneficial. With respect to a flexible transmit array, we propose to calculate the individual SAR of each coil element locally in real time. Using individual local PMU units and local RF current or voltage sensors, the local signal is directly sampled and SAR can be calculated or retrieved from a lookup table. The status of each individual Tx element is individually monitored in real time.

The local digital PMU unit can locally control, calibrate and decide on the safety status of each coil element. The local PMU acts as an interlock for the scanning process. As long as the coil state deviates from the desired safety status, scanning is prohibited.

The proposed system also measures the loading of the coil. This measurement enters a SAR model (experimental data) loaded in the memory and/or FPGA processor of each individual coil element.

Individual coil elements can have different SAR models (Elements in the centre of the array compared to those located at the edge of the coil may experience different loading by the subject and radiation effects. The reflected power is instantaneously absorbed in a local load on the coil array (e.g. utilizing a Gysel combiner). In case of an RF amplifier defect (e.g. oscillation), software error, break of cable the local PMU instantaneously detects the error, reduces RF power or interrupts the scan. The RF magnetic field B1 [µT/(W)0.5] is calculated using EM software, B1 mapping algorithms, and measurements by calibrated local RF current detection.

Figure 1:
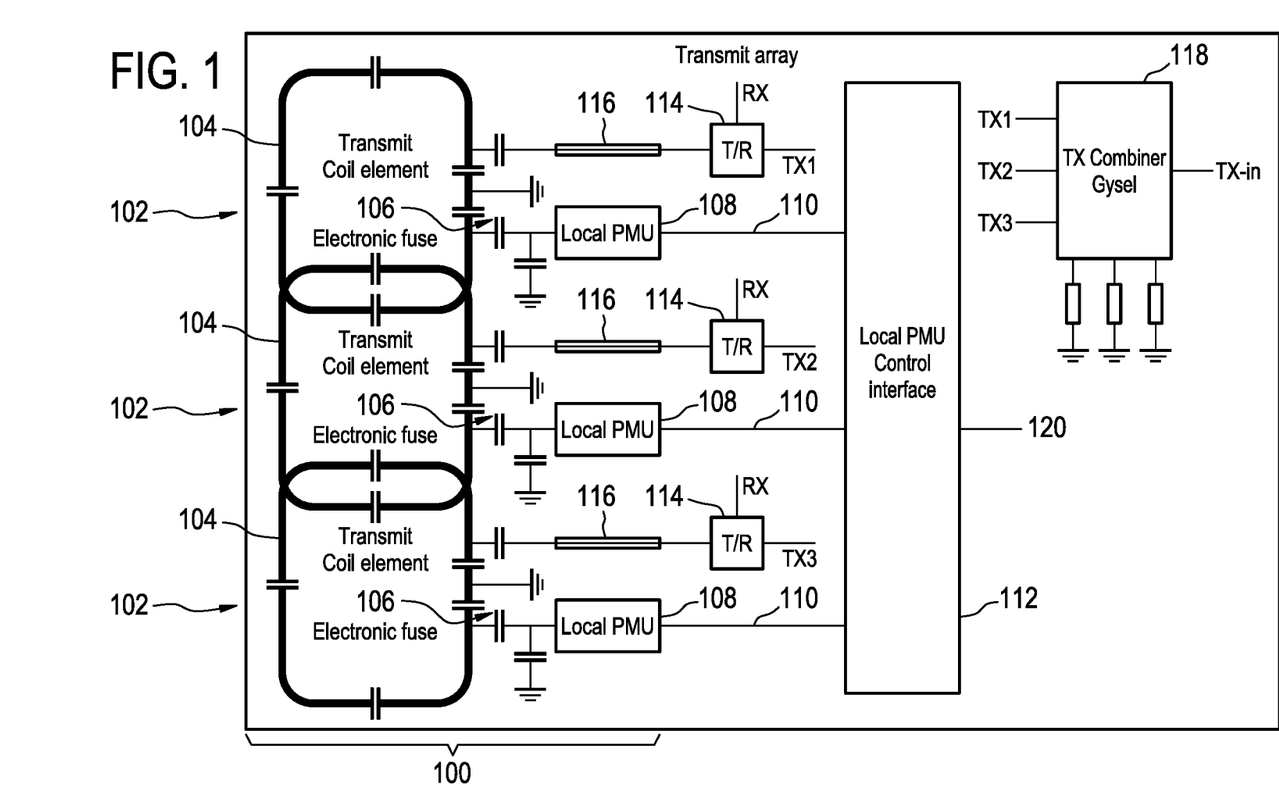
FIG. 1 shows an example of a multi-element transmit coil.

FIG. 1 shows an example of a multi-element transmit coil 100. The multi-element transmit coil 100 comprises a number of surface coil elements 102. Each surface coil element 102 has a voltage sensor 106, which is illustratively a capacitive voltage divider. A current sensor could also be substituted in place of the voltage sensor 106. A local power management unit 108 measures the voltage across the capacitive voltage divider and uses this to calculate the specific absorption ratio data using a processor. The local PMU 108 is connected to a local PMU controller interface 112 via an optical data transmission system 110. The local PMU controller interface 112 may simply forward the data to a magnetic resonance imaging system controller via another optical connection 120 or it may perform some calculations or modeling using the data from the local PMUs 108. Each coil circuit 104 has a respective transmitter receive switch 114 connected to a transmission line 116. The transmission portion of the transmitter receive switches 114 may be connected to a transmission combiner 118.

In FIG. 1, due to the close proximity of the individual coils, local pick up monitoring and calibration is difficult to achieve due to floating coupling effects, cable currents of pick up loop signal lines. Each individual transmit coil element is monitored by a local PMU processor unit, which individually measures the complex B1 transmit pulse signal by ADC sampling and direct processing. The digital signals are further processed by a local FPGA system. Integrated power combiners distribute RF power to several individual coils.

The voltage sensors 106 and/or the local PMUs 108 may also have an additional RF shield to reduce coupling from adjacent surface coil elements. For example, the shield could consist of copper foil and be wrapped around the sensor or may be a RF shield or conductive housing.

Figure 2:
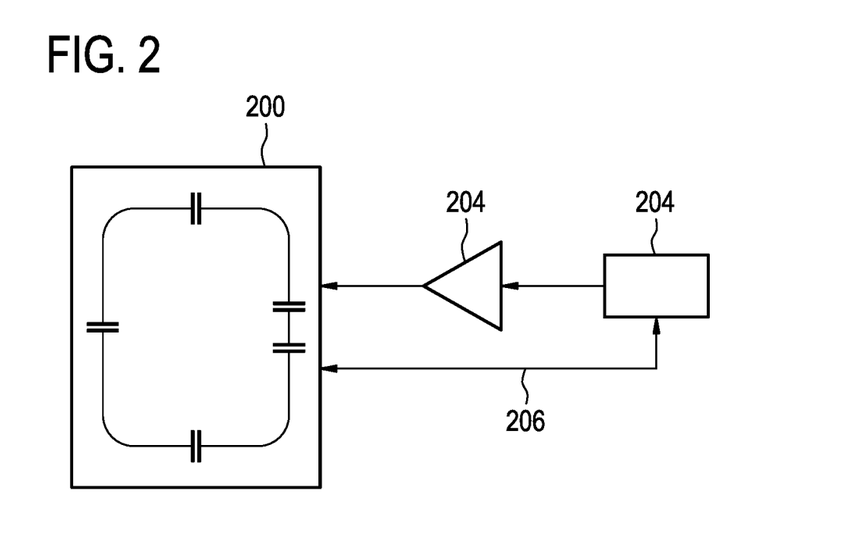
FIG. 2 shows an example of a control loop that can be formed using a multi-element transmit coil.

FIG. 2 shows an example of a control loop that can be formed using a multi-element transmit coil. In FIG. 2 a transmit coil element 200 is shown. It is supplied radio-frequency power by a radio-frequency amplifier 202. There is a control system 204, which controls the radio-frequency amplifier 202. Not shown is a PMU unit, which takes a radio-frequency measurement directly on the transmit coil element 200 when it is in use. There is a power management unit optical output 206 or optical data transmission system, which provides the control system 204 with the specific absorption rate data. If the estimated specific absorption rate produced by the transmit coil element is too high then the control system 204 can either reduce the power or shut off the power supplied by the radio-frequency amplifier 202 to the transmit coil element 200.

The control loop shown in FIG. 2 may also incorporate RF shielding to reduce coupling from adjacent surface coil elements. For example, the shield could consist of copper foil and be wrapped around sensor and/or any electronics used for supplying the radio frequency measurement.

Figure 3:
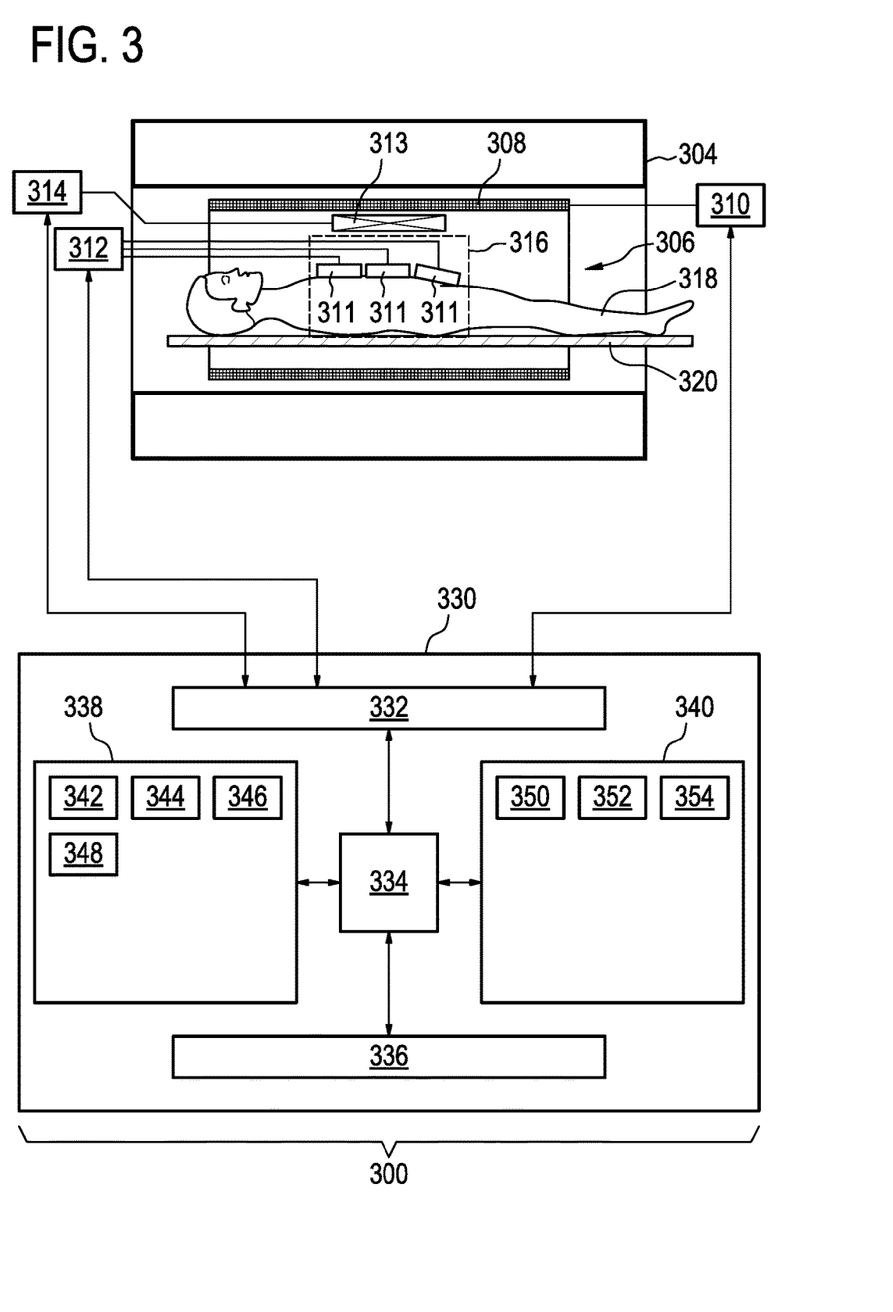
FIG. 3 shows an example of a magnetic resonance imaging system.

FIG. 3 shows an example of a magnetic resonance imaging system 300. The magnetic resonance imaging system 300 comprises a magnet 304. The magnet 304 is a cylindrical type superconducting magnet. The magnet has a liquid helium cooled cryostat with superconducting coils. It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore of the cylindrical magnet there is an imaging zone where the magnetic field is strong and uniform enough to perform magnetic resonance imaging.

Within the bore 306 of the magnet 304 there is a magnetic field gradient coil 308, which is supplied current by a magnetic field gradient coil power supply 310. The magnetic field gradient coil 308 is used to spatially encode magnetic spins within an imaging zone of the magnet during the acquisition of magnetic resonance data. The magnetic field gradient coil 308 is intended to be representative. Typically magnetic field gradient coils contain three separate sets of coils for spatially encoding in three orthogonal spatial directions. The current supplied to the magnetic field gradient coil 308 is controlled as a function of time and may be ramped or pulsed.

Within the bore of the magnet 304 is an imaging zone 316 where the magnetic field is uniform enough for performing magnetic resonance imaging. Also within the bore of the magnet 304 the subject 318 is reposing on a subject support 320 and has three surface coil elements 311 sitting on his surface. A portion of the subject 318 and the three surface coil elements 311 are within the imaging zone 316.

Each of the surface coil elements 311 are connected to a transmitter 312. There may be a galvanic connection, which supplies power to a power monitoring unit in each of the surface coil elements 311. There may also be a fiber optic connection between the power monitoring unit and the transmitter 312. There is an additional receive coil 313 mounted in the bore 306 of the magnet 304. The receive coil 313 is connected to a receiver 314. In some embodiments the transmitter 312 and the receiver 314 are merged into a single unit. Also in some embodiments the surface coil elements 311 may also be operable for receiving magnet resonance signals also. Power monitoring units built into the surface coil elements 311 send specific absorption rate data 348 to the transmitter 312. In some instances there may be a controller within the transmitter 312, which uses the specific absorption rate data 348 in a feedback loop as is illustrated in FIG. 2. The magnetic field gradient coil power supply 310, the transmitter 312 and the f 314 are shown as being connected to a hardware interface 332 of a computer system 330.

The computer system further comprises a processor 334 for executing machine executable instructions. The processor is shown as being connected to the hardware interface 332 and a user interface 336. The hardware interface 332 enables the processor 334 to control the functionality of the magnetic resonance imaging system 300. The processor 334 is also shown as being connected to computer storage 338 and computer memory 340.

The computer storage 338 is shown as containing a pulse sequence 342. The pulse sequence 342 is either a set of commands or set of instructions, which can be converted into commands, which enable the processor 334 to control the operation of the magnetic resonance imaging system 300 to acquire magnetic resonance data 344. The computer storage 338 is shown as containing the magnetic resonance data 344. The computer storage 338 is also shown as containing a magnetic resonance image 346 reconstructed from the magnetic resonance data 344. The computer storage 338 is shown as further containing specific absorption rate data 348. The specific absorption rate data 348 for example may be transferred from the transmitter 312 to the computer system 330.

The computer memory 340 is shown as containing a control module 350. The control module 350 contains computer-executable code, which enables the processor 334 to control the operation and function of the magnetic resonance imaging system 300. For instance the control module 350 may use the pulse sequence 342 to acquire the magnetic resonance data 344. The computer memory 340 is shown as further containing an image reconstruction module 352. The image reconstruction module 352 enables the processor 334 to reconstruct the magnetic resonance image 346 using the magnetic resonance data 344. The computer memory 340 is shown as further containing a specific absorption rate monitoring module 354. The specific absorption rate monitoring module 354 may analyze the specific absorption rate data 348 in some embodiments and then send commands to control the transmitter 312. For instance if one of the surface coil elements 311 is generating too much SAR then the processor 334 can send a command to cause the transmitter 312 to cut power to that particular surface coil element 311 or to reduce the power being sent to it.

Figure 4:
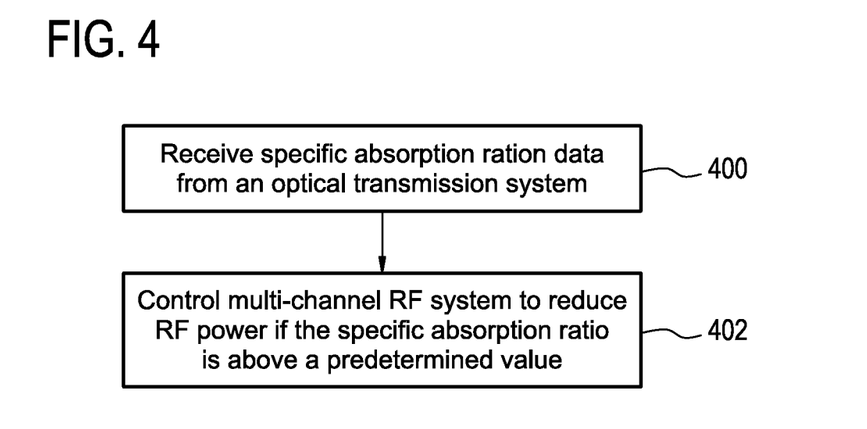
FIG. 4 shows a flowchart, which illustrates a method performed by a magnetic resonance imaging system controller.

FIG. 4 shows a flowchart, which illustrates a method performed by a magnetic resonance imaging system controller. First in step 400 specific absorption ratie data is received from an optical data transmission system of a power monitoring unit. The power monitoring unit is connected to a surface coil element and performs some sort of radio-frequency measurement on the coil circuit. Next in step 402 a multi-channel radio-frequency system is controlled to reduce power if a particular surface coil element has a specific absorption rate, which is above a predetermined value.

Figure 5:
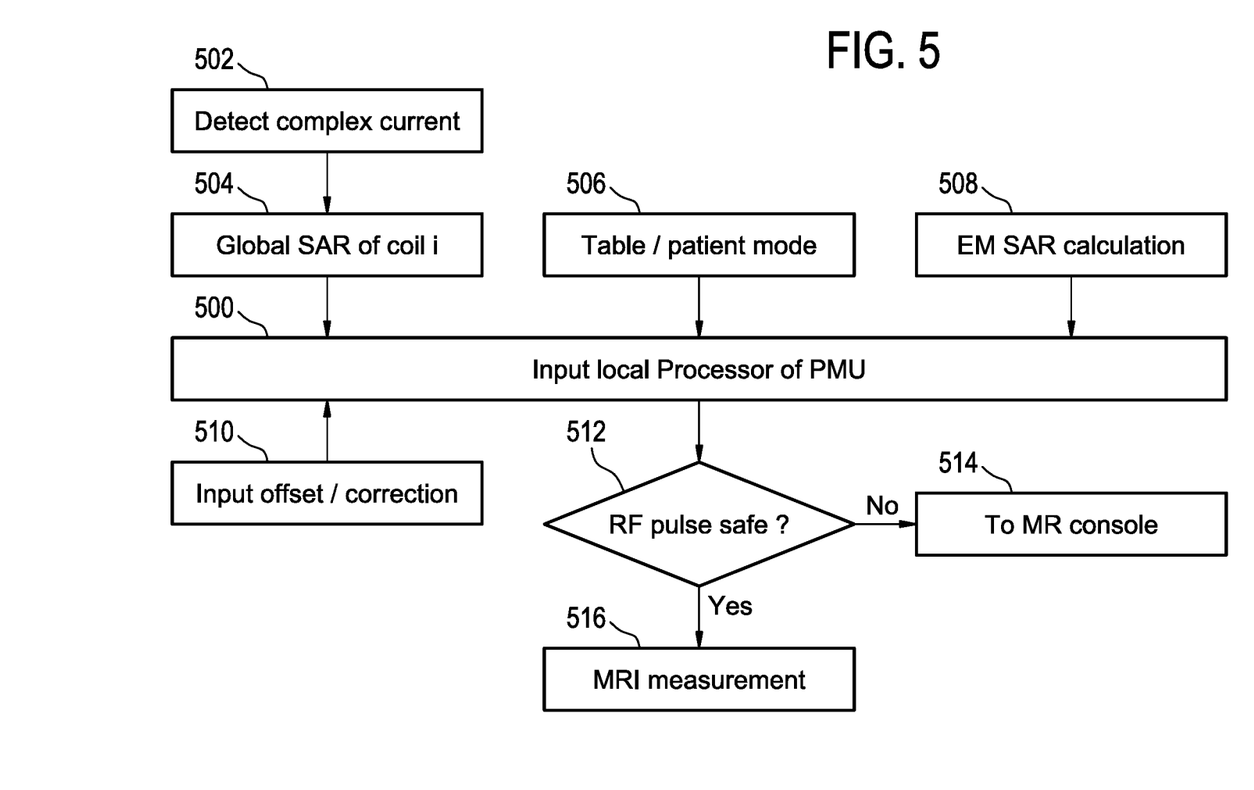
FIG. 5 shows some of the inputs and outputs that may be taken into consideration by a processor of a power management unit that is incorporated into a multi-element transmit coil.

FIG. 5 shows some of the inputs and outputs that may be taken into consideration by a processor of a power management unit that is incorporated into a multi-element transmit coil. Block 500 represents the input to a local processor of a PMU unit.

Some input that the block 500 may take may be the direct complex current 502, which is then modeled in terms of the global SAR 504, which is then input into the local processor. A table or patient model 506 may also be used as an input. There also may be an electromagnetic SAR calculation 508, which is used as an input. There may also be an input offset correction 510, which is input as an input value into the processor 500. The input offset correction may for instance be used to define safety levels. In 512 as an output a decision is made whether the RF pulse is safe or not. If the answer is no then either a warning message is sent to the magnetic resonance console 514 or the system directly controls the radio-frequency system to reduce power to the coil, which is causing a problem. If the radio-frequency pulse is safe then the method proceeds to performing a magnetic resonance imaging measurement 516.

Figure 6:
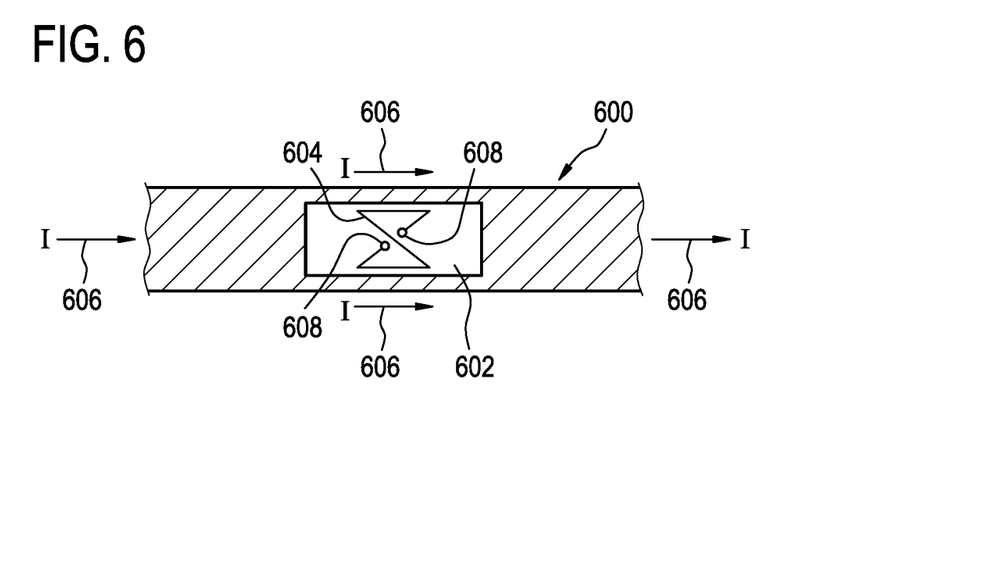
FIG. 6 shows an example of a current sensor.

FIG. 6 shows an example of a current sensor. There is a copper strip 600 with a window 602 cut in it. Within the window 602 is a butterfly coil 604. The arrows 606 indicate the direction of current at one particular moment in time. As the current varies there will be a voltage potential induced in the butterfly coil 604. These can be measured by putting a digital-to-analogue converter at the outputs 608. The butterfly coil 604 is also sometimes referred to as a FIG. 8 coil.

Figure 7:
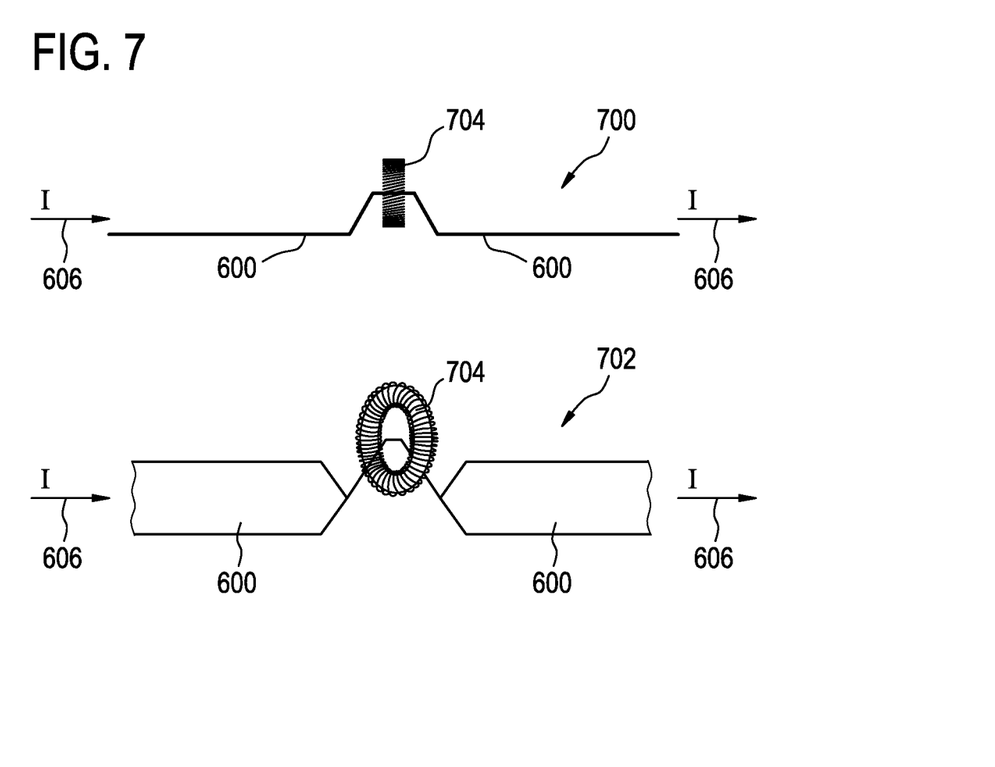
FIG. 7 shows a further example of a current sensor.

FIG. 7 shows a different example of a current sensor. There is a side view 700 and a respective view 702. There are copper strips 600, which serve as conductors in a coil circuit and the arrows 606 again indicate the direction of current at a particular moment in time. Between the two copper strips 600 is a toroidal pickup coil 704, which is used for measuring a change in the current, which is indicated by arrows 606. The toroidal pickup coil 704 may also sometimes be referred to as a B-dot probe.

The current sensor shown in FIG. 7 may also have an additional RF shield to reduce coupling from adjacent surface coil elements. For example, the shield could consist of copper foil and be wrapped around the sensor. This applies to sensors in general and could be used to shield the toroidal pickup coil 704 shown in FIG. 7 or also a planar sensor.

Figure 8:
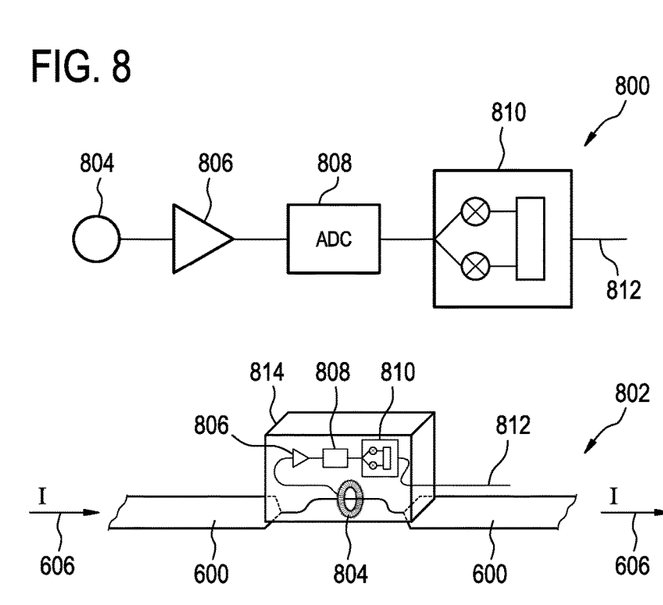
FIG. 8 shows a view of an RF chain of a power monitoring unit.

FIG. 8 shows a view of an RF chain of a power monitoring unit 800. View 802 then shows a view of the power monitoring unit 800 with the RF chain integrated into it. The power monitoring unit 800 shows a current sensor 804, which has its output going into an amplifier 806. The amplifier 806 then is input into a Field-Programmable Gate Array (FPGA) 810 with analog-to-digital converter (ADC) 808. The RF signal is digitized by ADC 808. In the digital domain, the signal is mixed to obtain I and Q channels, the function of a digital receiver. This is fundamental as phase and amplitude is used for calculating the SAR. Component 810 may comprise a digital receiver and a FPGA. The two circles with crosses in digital receiver 810 may symbolize a digital I Q receiver.

Component 810 also incorporates an optical converter. The output of the chain is then an optical fiber 812. In view 802 there is the power monitoring unit 814, which is connected to two copper strips 600. In this figure a highly integrated sensor is shown, for example a device or lumped component, which has the digital chain incorporated into it. This sensor is connected in series with the coil conductor and has the output of the optical fiber 812.

The current sensor shown in FIG. 8 may also have an additional RF shield to reduce coupling from adjacent surface coil elements. For example, the shield could consist of copper foil and be wrapped around the sensor or the power monitoring unit 800. In some examples the housing of the power monitoring unit 814 could function as an RF shield.

Figure 9:
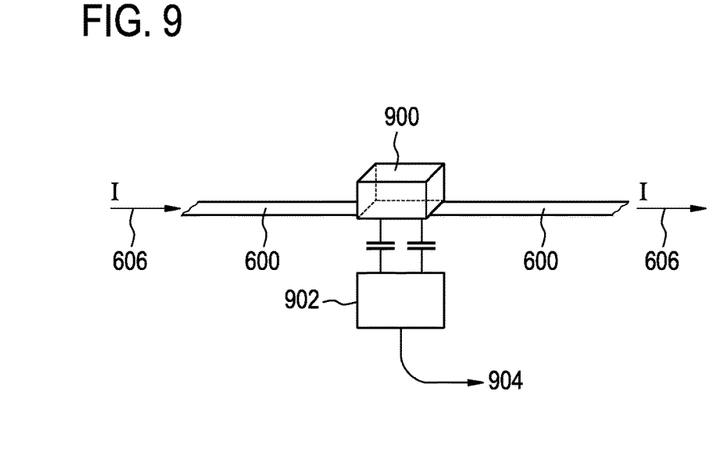
FIG. 9 shows a current sensor making use of a resonance capacitor of an RF coil.

FIG. 9 shows a current sensor making use of a resonance capacitor 900 of an RF coil. In some embodiments a matching network, as indicated here as two matching capacitors, may be needed in the sensing line. A balun 902 may also be needed for reducing common mode currents in the line. The signal is then fed to an RF sensor 904 as is described in FIG. 8.

Figure 10:
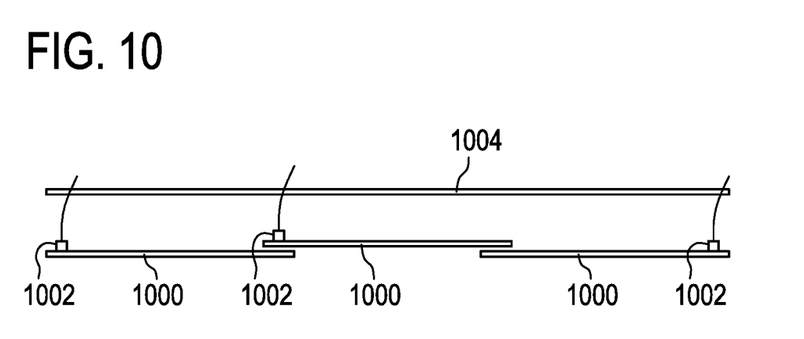
FIG. 10 shows an array of surface coil elements.

FIG. 10 shows an array of surface coil elements 1000. Incorporated into each of the surface coil elements 1000 is a current sensor 1002. The array of surface coil elements 1000 has a common radio-frequency shield 1004.

Figure 11:
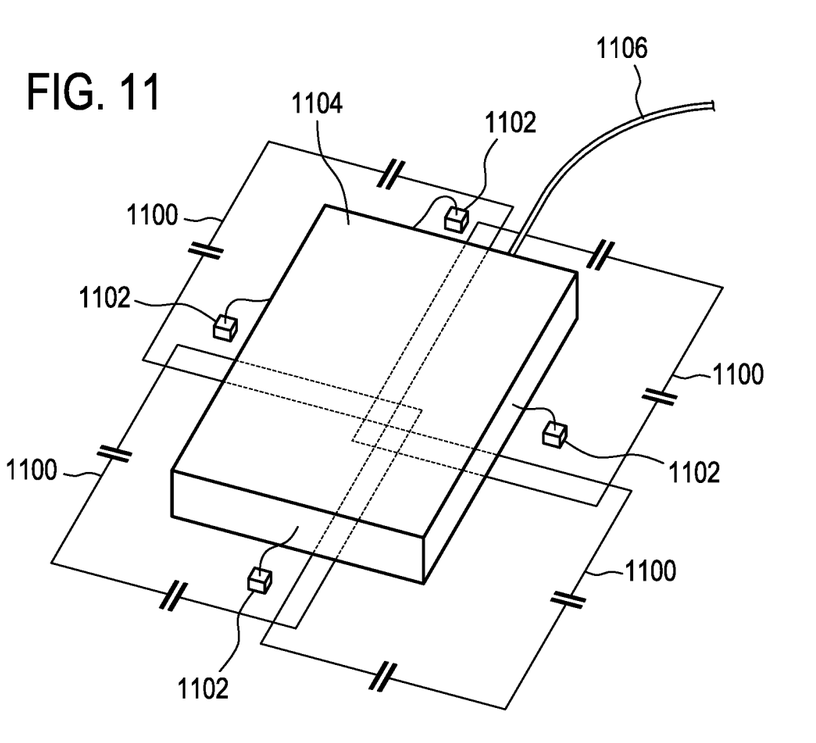
FIG. 11 shows an array of unshielded transmit and receive coils.

FIG. 11 shows an array of unshielded transmit and receive coil elements 1100. Each element is carrying a pick-up (PU)-circuit but the signal detection and conversion is shared in one housing 1104 for all coil elements. There is a sensor 1102 for each of the coils. The sensors 1102 are all connected to a digital receiver (not shown in FIG. 11), which is in the single housing 1104. A single digital output 1106 is used to connect with the magnetic resonance imaging controller.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 multi-element transmit coil
102 surface coil element
104 coil circuit
106 voltage sensor
108 power monitoring unit
110 optical data transmission system
112 local power management unit control interface
114 transmit receive switch
116 transmission line
118 transmit combiner
120 connection to magnetic resonance imaging system controller
200 transmit coil element
202 radio-frequency amplifier
204 control system
206 power management unit optical output
300 magnetic resonance imaging system
304 magnet
306 bore of magnet
308 magnetic field gradient coil
310 magnetic field gradient coil power supply
311 surface coil elements
312 transmitter
313 receive coil
314 receiver
316 imaging zone
318 subject
320 subject support
330 computer
332 hardware interface
334 processor
336 user interface
338 computer storage
340 computer memory
342 pulse sequence
344 magnetic resonance data
346 magnetic resonance image
348 specific absorption rate data
350 control module
352 image reconstruction module
354 specific absorption rate monitoring module
600 copper strip
602 window
604 butterfly coil
606 direction of current flow
608 outputs
700 side view
702 perspective view
704 toroidal coil
800 RF chain of power monitoring unit
802 view of power monitoring unit
804 current sensor
806 amplifier
808 analog to digital converter
810 optical converter
812 fiber optic
814 power monitoring unit
900 capacitor
902 balun
904 output to digital RF sensor
1000 coil
1002 sensor
1004 radio-frequency shield
1100 coil
1102 sensor
1104 digital receiver
1106 optical output

The invention claimed is:

1. A multi-element transmit coil comprising:
a plurality of surface coil elements, each surface coil element comprising a coil circuit, each coil circuit comprising a radio-frequency sensor, which comprises a current sensor and/or a voltage sensor;
a plurality of power monitoring units each comprising an analog-to-digital converter directly connected to one of the radio frequency sensors, each power monitoring unit comprising a processor, and each of the power monitoring units being connected to its analog to digital converter, wherein: each processor is configured to receive at least one radio-frequency measurement from its coil circuit using the analog to digital converter; each processor is configured to generate specific absorption rate data from the radio-frequency measurement for its respective surface coil elements; and wherein each of the plurality of power monitoring units is built-in into its respective surface coil elements; and
an optical data transmission system connected to each of the processors, wherein: the optical data transmission system is arranged for connecting to a magnetic resonance imaging system controller; and the optical data transmission system is arranged for transferring the specific absorption rate data from the processor to the magnetic resonance imaging system controller.

2. The multi-element transmit coil of claim 1, wherein each of the plurality surface coil elements is flexible.

3. The multi-element transmit coil of claim 1, wherein: each of the plurality of surface coil elements are disposed over a support structure; and the support structure is operable for receiving a portion of a subject.

4. The multi-element transmit coil of claim 1, wherein at least a portion of the plurality of surface coil elements overlap one another.

5. The multi-element transmit coil of claim 1, wherein the power monitoring unit and its analog to digital converter are disposed within a single housing.

6. The multi-element transmit coil claim 1, wherein: the processor is arranged to determine a specific absorption rate estimate for each of the plurality of surface coil elements using the radio-frequency measurements and a look up table; and the specific absorption rate data comprises the specific absorption rate estimate for each of the plurality of surface coil elements.

7. The multi-element transmit coil of claim 1, wherein the radio-frequency sensor is a compensated butterfly coil.

8. The multi-element transmit coil of claim 1, wherein the radio frequency sensor is a toroidal pickup coil.

9. The multi-element transmit coil of claim 1, wherein the radio frequency sensor is integrated into a capacitance of the coil circuit.

10. The multi-element transmit coil of claim 1, wherein the processors are field-programmable gate arrays.

11. The multi-element transmit coil of claim 1, wherein the multi-element transmit coil is configured to receive a magnetic resonance signal.

12. A magnetic resonance imaging system, comprising:
the magnetic resonance imaging system controller configured to receive specific absorption ratio data from the optical data transmission system of a multi-element transmit coil according to claim 1;
the multi-channel radio frequency system configured to: supply radio-frequency power to each of the plurality of surface coil elements; and reduce radio frequency power supplied to a surface coil element selected from the plurality of surface coil elements if the specific absorption rate data indicates the specific absorption ratio is above a predetermined value for the surface coil element.

13. The magnetic resonance imaging system of claim 12, wherein the magnetic resonance imaging system comprises the multi-element transmit coil.

14. A non-transitory computer program product comprising machine executable instructions for execution by the magnetic resonance imaging system controller configured to receive specific absorption ratio data from the optical data transmission system of a multi-element transmit coil according to claim 1, the magnetic resonance imaging system comprising the multi-channel radio frequency system, wherein the multi-channel radio frequency system is configured to supply radio-frequency power to each of the plurality of surface coil elements, wherein execution of the instructions cause the magnetic resonance imaging system controller to:
receive the specific absorption ratio data from the optical data transmission system; and
control the multi-channel radio frequency system to reduce radio frequency power supplied to a surface coil element selected from the plurality of surface coil elements if the specific absorption ratio data indicates the specific absorption ratio is above a predetermined value for the surface coil element.

15. The multi-element transmit coil of claim 1, wherein the plurality surface coil elements do not overlap.

16. A multi-element transmit coil comprising:
a plurality of surface coil elements, each surface coil element comprising a coil circuit, each coil circuit comprising a radio-frequency sensor, which comprises a compensated butterfly coil, or a toroidal pickup coil;
a plurality of power monitoring units each comprising an analog-to-digital converter directly connected to one of the radio frequency sensors, each power monitoring unit comprising a processor, and each of the power monitoring units being connected to its analog to digital converter, wherein: each processor is configured to receive at least one radio-frequency measurement from its coil circuit using the analog to digital converter; and the processor is configured to generate specific absorption rate data from the radio-frequency measurement for its surface coil elements;
an optical data transmission system connected to each of the processors, wherein: the optical data transmission system is arranged for connecting to a magnetic resonance imaging system controller; and the optical data transmission system is arranged for transferring the specific absorption rate data from the processor to the magnetic resonance imaging system controller.

17. A non-transitory computer program product comprising machine executable instructions for execution by the magnetic resonance imaging system controller configured to receive specific absorption ratio data from the optical data transmission system of a multi-element transmit coil according to claim 16, the magnetic resonance imaging system comprising the multi-channel radio frequency system, wherein the multi-channel radio frequency system is configured supply radio-frequency power to each of the plurality of surface coil elements, wherein execution of the instructions cause the magnetic resonance imaging system controller to:
receive the specific absorption ratio data from the optical data transmission system; and
control the multi-channel radio frequency system to reduce radio frequency power supplied to a surface coil element selected from the plurality of surface coil elements if the specific absorption ratio data indicates the specific absorption ratio is above a predetermined value for the surface coil element.

18. A magnetic resonance imaging system, comprising:
the magnetic resonance imaging system controller configured to receive specific absorption ratio data from the optical data transmission system of a multi-element transmit coil according to claim 16;
the multi-channel radio frequency system configured to: supply radio-frequency power to each of the plurality of surface coil elements; and reduce radio frequency power supplied to a surface coil element selected from the plurality of surface coil elements if the specific absorption rate data indicates the specific absorption ratio is above a predetermined value for the surface coil element.

19. The magnetic resonance imaging system of claim 16, wherein the magnetic resonance imaging system comprises the multi-element transmit coil.

20. The multi-element transmit coil of claim 16, wherein each of the plurality of surface coil elements is flexible.

21. The multi-element transmit coil of claim 16, wherein:
each of the plurality of surface coil elements are disposed over a support structure; and
the support structure is operable for receiving a portion of a subject.

22. The multi-element transmit coil of claim 16, wherein at least a portion of the plurality of surface coil elements overlap one another.

23. The multi-element transmit coil of claim 16, wherein the power monitoring unit and its analog to digital converter are within a single housing.

24. The multi-element transmit coil claim 16, wherein: the processor is arranged to determine a specific absorption rate estimate for each of the plurality of surface coil elements using the radio-frequency measurements and a look up table; and the specific absorption rate data comprises the specific absorption rate estimate for each of the plurality of surface coil elements.

25. The multi-element transmit coil of claim 16, wherein the radio-frequency sensor is a compensated butterfly coil.

26. The multi-element transmit coil of claim 16, wherein the radio frequency sensor is a toroidal pickup coil.

27. The multi-element transmit coil of claim 16, wherein the radio frequency sensor is integrated into a capacitance of the coil circuit.

28. The multi-element transmit coil of claim 16, wherein the processors are field-programmable gate arrays.

29. The multi-element transmit coil of claim 16, wherein the multi-element transmit coil is configured to receive a magnetic resonance signal.

\* \* \* \* \*